United States Patent
Roy (10) Patent No.: US 10,531,022 B2
(45) Date of Patent: Jan. 7, 2020

(54) IMAGE SENSOR OF GLOBAL SHUTTER TYPE

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/995,249

(22) Filed: Jun. 1, 2018

(65) Prior Publication Data

US 2018/0278863 A1  Sep. 27, 2018

Related U.S. Application Data

(62) Division of application No. 15/358,737, filed on Nov. 22, 2016, now Pat. No. 10,321,073.

(30) Foreign Application Priority Data

Jun. 6, 2016 (FR) ..................................... 16 55152
Jun. 6, 2016 (FR) ..................................... 16 55153

(51) Int. Cl.
*H04N 5/353* (2011.01)
*H01L 27/146* (2006.01)
(Continued)

(52) U.S. Cl.
CPC ......... *H04N 5/353* (2013.01); *H01L 27/1464* (2013.01); *H01L 27/14614* (2013.01);
(Continued)

(58) Field of Classification Search
CPC ... H04N 5/353; H04N 5/378; H01L 27/14614
See application file for complete search history.

(56) References Cited

U.S. PATENT DOCUMENTS 8,513,761 B2   8/2013 Roy et al.
2006/0192938 A1 8/2006 Kawahito
(Continued)

FOREIGN PATENT DOCUMENTS

EP  1887626 A1  2/2008
EP  2216817 A1  8/2010

OTHER PUBLICATIONS

INPI Search Report and Written Opinion for FR 1655153 dated Feb. 8, 2017 (8 pages).

(Continued)

*Primary Examiner* — Christopher K Peterson
(74) *Attorney, Agent, or Firm* — Crowe & Dunlevy (57) ABSTRACT

Each pixel of a global shutter back-side illuminated image sensor includes a photosensitive area. On a front surface, a first transistor includes a vertical ring-shaped electrode penetrating into the photosensitive area and laterally delimiting a memory area. The memory area penetrates into the photosensitive area less deeply than the insulated vertical ring-shaped electrode. A read area is formed in an intermediate area which is formed in the memory area. The memory area, the intermediate area and read area define a second transistor having an insulated horizontal electrode forming a gate of the second transistor. The memory area may be formed by a first and second memory areas and an output signal is generated indicative of a difference between charge stored in the first memory area and charge stored in the second memory area after a charge transfer to the first memory area.

19 Claims, 6 Drawing Sheets

(51) Int. Cl.
*H04N 5/372* (2011.01)
*H04N 5/378* (2011.01)
*H04N 5/363* (2011.01)

(52) U.S. Cl.
CPC ....... *H01L 27/14643* (2013.01); *H04N 5/372* (2013.01); *H04N 5/378* (2013.01); *H04N 5/363* (2013.01)

(56) References Cited

U.S. PATENT DOCUMENTS

| | | |
|---|---|---|
| 2010/0193845 A1* | 8/2010 | Roy .................... H01L 27/1463 257/228 |
| 2010/0289935 A1 | 11/2010 | Ohno |
| 2011/0019045 A1* | 1/2011 | Lin ................... H01L 27/14612 348/296 |
| 2012/0161213 A1 | 6/2012 | Roy et al. |
| 2013/0161213 A1 | 2/2013 | Roy et al. |
| 2016/0351606 A1* | 12/2016 | Azami ................ H01L 27/1461 |

OTHER PUBLICATIONS

INPI Search Report and Written Opinion for FR 1655152 dated Jan. 30, 2017 (7 pages).

\* cited by examiner

IMAGE SENSOR OF GLOBAL SHUTTER TYPE

CROSS-REFERENCE TO RELATED APPLICATIONS

This application is a divisional of U.S. patent application Ser. No. 15/358,737 filed Nov. 22, 2016, which claims the priority benefit of French Application for Patent No. 1655153 filed Jun. 6, 2016, and the priority benefit of French Application for Patent No. 1655152 filed Jun. 6, 2016, the disclosures of which are hereby incorporated by reference in their entirety.

TECHNICAL FIELD

The present disclosure relates to an image sensor of global shutter type, and more particularly to a pixel of such an image sensor.

BACKGROUND

Figure 1:
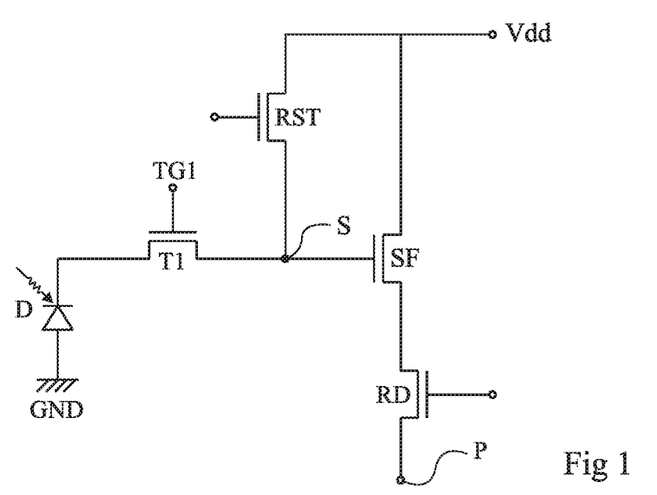
FIG. 1, previously described, illustrates an example of a pixel circuit adapted to a control of rolling shutter type, FIG. 2, previously described, illustrates an example of a pixel circuit adapted to a control of global shutter type, FIG. 3, previously described, is a cross-section view of an example of a back-side illuminated pixel adapted to a control of rolling shutter type, FIGS. 4A, 4B, and 4C schematically show an embodiment of a back-side illuminated pixel adapted to a control of global shutter type.

FIG. 1 corresponds to FIG. 1 of U.S. Pat. No. 8,513,761 (incorporated by reference), which illustrates an example of an electric circuit of a pixel of an image sensor of rolling shutter type.

A photodiode D is connected to a sense node S by a transfer transistor T1 having its gates connected to a terminal TG1. A read circuit comprises an N-channel MOS transistor RST, interposed between a power supply rail Vdd and sense node S, and two series-connected N-channel MOS transistors SF and RD. The drain of transistor SF is connected to power supply rail Vdd. The source of transistor RD is connected to a terminal P, itself connected to a processing circuit (not shown). The gate of read transistor SF, assembled as a source follower, is connected to sense node S. Generally, the control signals of transistors T1, RD, and RST are supplied by one or a plurality of control circuits (not shown) of the image sensor and may be supplied to all the pixels of a same row of the pixel array of the sensor.

In a sensor of rolling shutter type, the pixels receive an illumination and store photogenerated charges in photodiode D during an integration phase, transistor T1 then being in the off state. The pixels are read during a read phase. The read phase comprises an operation of transferring the photogenerated charges from photodiode D to sense node S by setting transistor T1 to the on state, and an operation of reading the voltage of sense node S with the read circuit. This voltage is representative of the quantity of charges photogenerated during the integration phase and forms an output signal of the pixel.

Such a sensor is said to be of rolling shutter type since the transfer operation and the read operation are carried out for all the pixels in a row before being successively carried out for the other pixel rows of the array. The rows of the array thus capture a scene but at times shifted with respect to one another.

Figure 2:
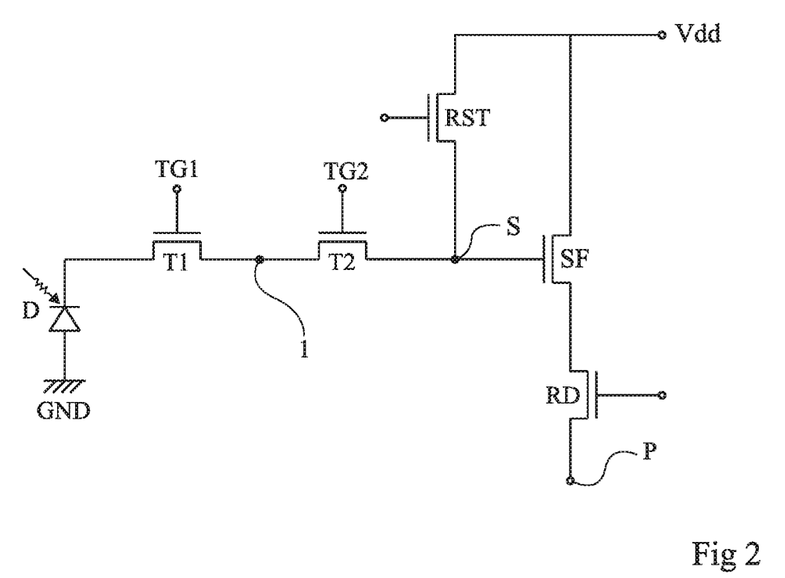

FIG. 2 schematically illustrates an example of an electric circuit of an image sensor pixel of global shutter type.

As in FIG. 1, the circuit of FIG. 2 comprises photodiode D, sense node S, transistor T1, and the read circuit formed of transistors RST, RD, and SF, the read circuit being connected to sense node S in the same way as in FIG. 1. Unlike the circuit of FIG. 1, transfer transistor T1 is connected to a memory cell 1 rather than to sense node S. Further, a transfer transistor T2 having its gate connected to a terminal TG2 is connected between memory cell 1 and sensor node S.

In a sensor of global shutter type, the read phase comprises a transfer operation during which transistor T1 is turned on, the photogenerated charges stored in photodiode D being then transferred to memory cell 1. The transfer operation is simultaneously carried out for all the pixels in the array, which enables to store a complete image in all memory cells 1 of the sensor. Once the transfer operation has been performed, transistor T1 is set back to the off state and a new integration phase may start while the read phase carries on. The read phase then comprises an additional transfer operation during which transistor T2 is set to the on state to transfer the charges stored in memory cell 1 to sense node S. In the same way as in a sensor of rolling shutter type, the voltage of node S is then read during a read operation. The additional transfer operation and the operation of reading node S are carried out for all the pixels in a row before being successively repeated for the other rows of the array.

Due to the fact that a complete image is stored in all the memory cells 1 of the sensor, this provides images without the defects due to the time shifts which may occur in images obtained from an image sensor of rolling shutter type. However, as compared with a pixel of rolling shutter type, in a pixel of global shutter type, it is necessary to further provide a memory cell and a transistor.

Figure 3:
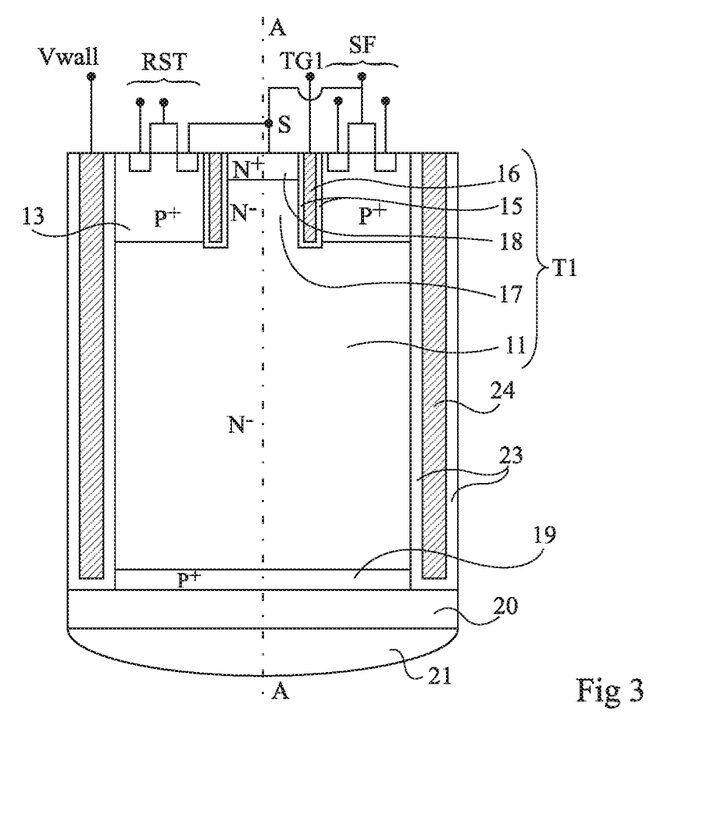

FIG. 3 corresponds to FIG. 5 of U.S. Pat. No. 8,513,761, which is a cross-section view of an example of a pixel of a sensor of rolling shutter type.

The pixel comprises a portion of a lightly-doped N-type silicon substrate 11 (N$^-$) laterally delimited by a conductive wall 24, insulated by an insulator 23, connected to a terminal Vwall. On the front or upper surface side of the pixel and in a substantially central area of the pixel, transfer transistor T1 comprises a vertical ring-shaped electrode 16 insulated by an insulator 15. An interconnection structure, not shown, rests on the front surface of the pixel and connects insulated electrode 16 to terminal TG1. Electrode 16 laterally delimits a region comprising a lower lightly-doped N-type portion 17 (N$^-$), and an upper heavily-doped N-type portion 18 (N$^+$). Upper portion or charge collection area 18 is directly connected to node S by the interconnection structure. Lower portion or transfer area 17 extends from charge collection area 18 down to a depth substantially equal to or smaller than that of electrode 16. A heavily-doped P-type well 13 (P$^+$) penetrates into substrate 11 down to a depth smaller than or substantially equal to that of insulated vertical electrode 16. Well 13 has various transistors formed therein, for example, transistors RD (not shown), RST, and SF of the pixel read circuit. A heavily-doped P-type layer 19 (P$^+$) is arranged at the lower surface of substrate 11. Further, the back side or lower surface of the pixel is covered with a color filter 20 and with a lens 21.

During an integration phase, the pixel receives an illumination on its back side, whereby charges are photogenerated and accumulate in substrate 11. Thus, substrate 11 corresponds to photodiode D of the circuit of FIG. 1 and forms a photosensitive area designated, like the substrate, with reference numeral 11. During the integration phase, transistor T1 is in the off state. This transistor is set to the on state during the transfer operation of the read phase such as described in relation with FIG. 1.

The pixel of FIG. 3 has many advantages. In particular, this pixel may have very small dimensions.

It would be desirable to have a pixel adapted to a control of global shutter type and which keeps the advantages of very small dimensions of the pixel of FIG. 3.

It would also be desirable to have a pixel of global shutter type which comprises correction means to decrease or suppress the influence of parasitic charges on the output signal of the pixel.

SUMMARY

Thus, an embodiment provides a back-side illuminated image sensor of global shutter type, each pixel of the sensor comprising a photosensitive area of a first conductivity type; on the front surface side, a first transistor comprising a vertical ring-shaped electrode penetrating into the photosensitive area and laterally delimiting a memory area of the first conductivity type which penetrates into the photosensitive area less deeply than the insulated vertical ring-shaped electrode; and a read area of the first conductivity type formed in an intermediate area of the second conductivity type which is formed in the memory area, the assembly of the memory area, of the intermediate area, and of the read area defining a second transistor having an insulated horizontal electrode forming a gate.

According to an embodiment, for each pixel, the photosensitive area has a first doping level, the memory area has a second doping level greater than the first doping level, and the read area has a third doping level greater than the second doping level.

According to an embodiment, each pixel comprises a transfer area laterally delimited by the insulated vertical ring-shaped electrode, the transfer area extending from the photosensitive area to the memory area.

According to an embodiment, the transfer area of each pixel is of the first conductivity type.

According to an embodiment, the transfer area of each pixel has the first doping level.

According to an embodiment, each pixel further comprises a well of the second conductivity type penetrating into the photosensitive area from the front side less deeply than the insulated vertical ring-shaped electrode.

According to an embodiment, each pixel is laterally delimited by an insulated conductive wall.

According to an embodiment, the insulated conductive wall extends from the front side to the back side.

According to an embodiment, the sensor further comprises a control circuit capable, for each pixel, of applying first voltages to the insulated vertical ring-shaped electrode to control a charge transfer from the photosensitive area to the memory area, and second voltages to the insulated horizontal electrode to control a charge transfer from the memory area to the read area.

According to an embodiment, the control circuit is capable of biasing the insulated conductive wall.

Another embodiment provides an image sensor comprising a plurality of pixels, each comprising a photosensitive area, a first memory area, a second memory area, and a first insulated electrode capable of controlling a charge transfer from the photosensitive area to the first memory area; and processing means capable, for each pixel, of supplying an output signal characteristic of the difference between the charges stored in the first memory area and the second memory area after the charge transfer to the first memory area.

According to an embodiment, each pixel comprises a second insulated electrode capable of keeping permanently blocked a charge transfer from the photosensitive area to the second memory area.

According to an embodiment, each pixel comprises a third insulated electrode capable of controlling a charge transfer from the first memory area to a sense node of the pixel, and a fourth insulated electrode capable of controlling a charge transfer from the second memory area to the sense node of the pixel.

According to an embodiment, the sensor comprises a read circuit connected to the sense node of each pixel, the read circuit being capable of reading a first voltage after a charge transfer from the first memory area to the sense node, and a second voltage after a charge transfer from the second memory area to the sense node.

According to an embodiment, the processing means determine the output signal from the first voltage and from the second voltage.

According to an embodiment, the sensor comprises a control circuit capable of applying control signals to each insulated electrode.

BRIEF DESCRIPTION OF THE DRAWINGS

The foregoing and other features and advantages will be discussed in detail in the following non-limiting description of dedicated embodiments in connection with the accompanying drawings, wherein.

DETAILED DESCRIPTION

The same elements have been designated with the same reference numerals in the various drawings and, further, the various drawings are not to scale. For clarity, only those steps and elements which are useful to the understanding of the described embodiments have been shown and are detailed.

In the following description, terms "upper", "lower", "vertical", "horizontal", etc., refer to the orientation of the concerned elements in the corresponding drawings, it being understood that, in practice, the pixels shown in the different drawings may be oriented differently. Unless otherwise specified, term "substantially" and expression "in the order of" mean to within 10%, preferably to within 5%, and a first element "resting on" or "coating" a second element means that the first and second elements are in contact with each other.

Figure 4A:
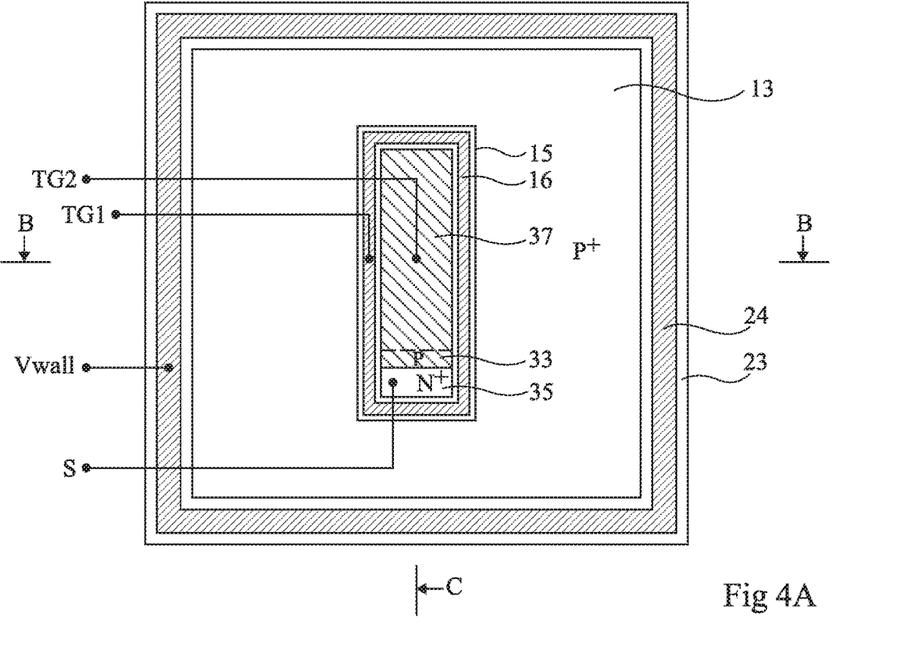
Figure 4B:
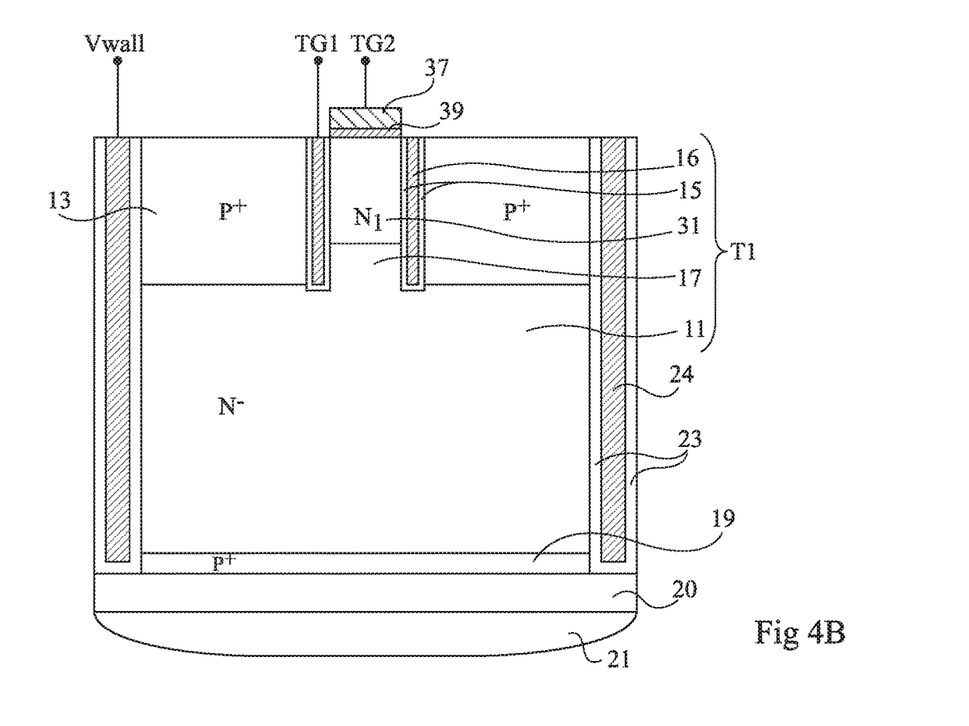
Figure 4C:
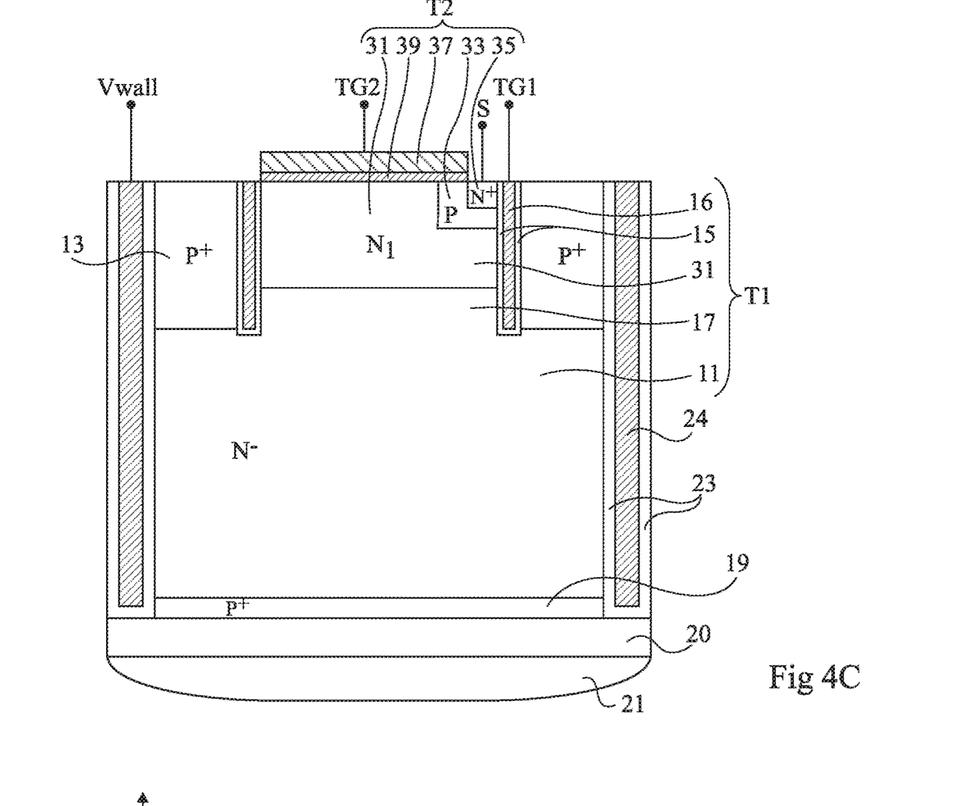

FIGS. 4A to 4C schematically show an embodiment of a pixel of a sensor of global shutter type capable of receiving an illumination on its back side. FIG. 4A is a top view of the pixel and FIGS. 4B and 4C are cross-section views along respective planes BB and CC of FIG. 4A.

The pixel comprises the same elements as the pixel of FIG. 3, with the difference that the charge collection area, here designated with reference numeral 31, is not directly connected to sense node S, and that a transistor T2 such as described in relation with FIG. 2 is formed in area 31.

More particularly, as better shown in FIG. 4C, transistor T2 comprises a P-type doped intermediate area 33 formed in charge collection area 31 and penetrating into area 31 across a portion only of the thickness thereof, and a heavily N-type doped read area 35 ($N^+$) formed in intermediate P area 33. A horizontal electrode 37 insulated from substrate 11 by an insulator 39 forms the gate of transistor T2. Gate 37 rests on intermediate P area 33 and may extend over all or part of memory area 31. Gate 37 is connected to terminal TG2, and read area 35 is connected to sense node S. In this embodiment, read area 35 is arranged against an edge of insulated electrode 16 and gate 37 has an edge aligned with read area 35.

Charge collection area 31 forms a memory area. Memory area 31 is N-type doped, with a doping level $N_1$ greater than doping level $N^-$ of photosensitive area 11. Memory area 31 is shallower than electrode 16. In top view, memory area 31 may have an elongated shape, for example, the shape of a rectangle which is five times longer than it is wide.

Photosensitive area 11, transfer transistor T1, memory area 13, transfer transistor T2, and node S are connected to one another in a circuit such as described in relation with FIG. 2, memory area 31 corresponding to memory cell 1.

It should be noted that transistor T2 is arranged at an available location of charge collection area 31. Adding this transistor thus causes no surface area increase with respect to the pixel of FIG. 3.

Figure 5:
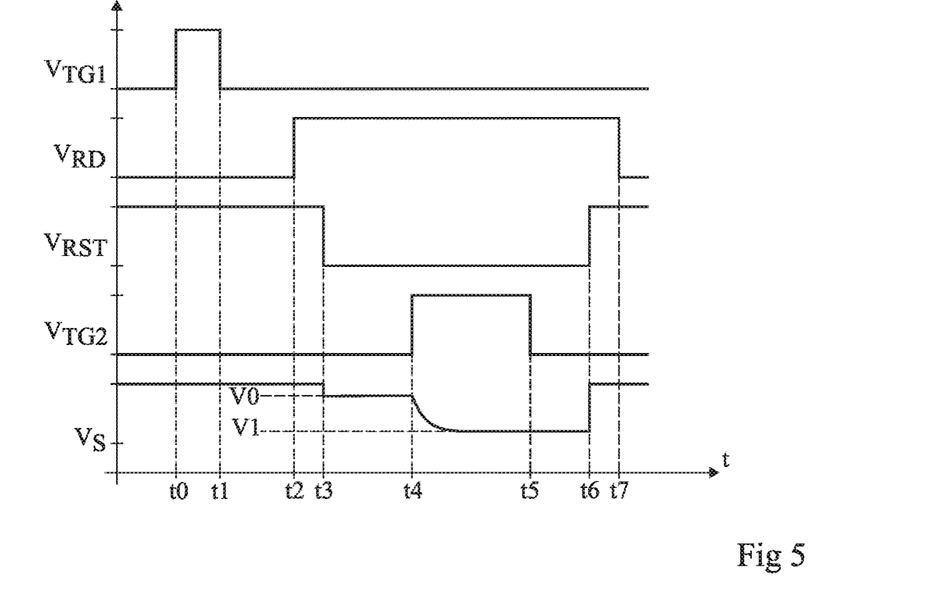
FIG. 5 is a timing diagram illustrating an embodiment of the pixel of FIGS. 4A to 4C, FIGS. 6A, 6B, and 6C schematically show an embodiment of a back-side illuminated pixel adapted to a global shutter control and comprising means for correcting the pixel output signal.

FIG. 5 shows a timing diagram of voltage $V_S$ at the level of node S and of control signals $V_{TG1}$, $V_{TG2}$, $V_{RD}$, and $V_{RST}$, respectively applied to terminal TG1, to terminal TG2, to the gate of transistor RD, and to the gate of transistor RST. Signals $V_{TG1}$, $V_{TG2}$, $V_{RD}$ and $V_{RST}$ vary between high and low levels which may be different for each of the signals. The different control signals may be supplied by one or a plurality of sensor control circuits.

In operation, $P^+$ well 13 is biased to a low reference voltage, for example, to ground voltage GND. A bias signal lower than the low reference voltage, for example, −1 V, is applied to terminal Vwall, which causes an accumulation of holes along insulated conductive wall 24. A potential well then forms in photosensitive area 11.

Before a time t0, during an integration phase, the pixel receives an illumination on its back side and photogenerated electrons are trapped by the potential well of photosensitive area 11 where they accumulate. During the integration phase, transistor RD is kept in the off state. Transistor RST is kept in the on state. Transistor T1 is kept in the off state, so that transfer area 17 is fully electron-depleted. As a result, a potential barrier creates in area 17, between photosensitive area 11 and memory area 31, thus inhibiting the flowing of the photogenerated electrons accumulated in photosensitive area 11 to memory area 31. Further, a potential well forms in memory area 31. Transistor t2 is kept in the off state by keeping control signal $V_{TG2}$ at a negative voltage, for example, −0.8 V.

At time t0, at the beginning of a pixel read phase, in each sensor pixel, the photogenerated electrons are transferred from photosensitive area 11 into memory area 31. To achieve this, transistor T1 is set to the on state. The depletion of transfer area 17 stops and, further, the potential well in memory area 31 becomes deeper than that of photosensitive area 11, which causes the transfer of the photogenerated electrons to memory area 31.

At a time t1, the operation of transfer of the photogenerated electrons to memory area 31 is over and transistor T1 is set back to the off state.

A new integration phase common to all the sensor pixels can then start while the read phase carries on. The resetting and the restarting of the photodiode integration phase may be controlled by conventional means, which are not described herein. Similarly, an anti-dazzle system which may be a specific implementation of the integration reset and starting system is preferably provided.

At a time t2, each pixel of a same row is selected. To achieve this, transistor RD of the pixel read circuit is set to the on state.

At a time t3, transistor RST is set to the off state. Voltage $V_S$ settles at a level V0 which may be lower than power supply voltage Vdd due to a coupling with transistor RST. Voltage level V0 is read by the read circuit and is stored by a processing circuit connected to terminal P of the read circuit.

At a time t4, the photogenerated electrons stored in memory area 31 are transferred into read area 35. To achieve this, transistor T2 is set to the on state. Voltage $V_S$ then decreases to a level V1.

At a time t5, the operation of transfer of the photogenerated electrons to read area 35 is over and transistor T2 is set back to the off state. Voltage level V1 is then read by the read circuit and stored by the processing circuit. Voltage level V0 may be subtracted from voltage level V1 to do away with the thermal noise essentially resulting from a coupling with transistor RST. The difference between voltage levels V1 and V0 is representative of the quantity of photogenerated charges in photosensitive area 11 before time t0 and forms the pixel output signal.

At a time t6, transistor RST is set back to the on state and, at a time t7 subsequent to time t5, the pixel is deselected by setting transistor RD back to the off state. The pixel read phase is over, and more generally the read phase is over for all the pixels in the row. The steps carried out between times t2 and t6 are then successively repeated for each of the other rows of pixels of the array until all the sensor pixels have been read.

As previously indicated, the pixel of FIGS. 4A to 4C is adapted to a control of global shutter type, is capable of receiving a back-side illumination, and keeps the advantage of small dimensions of the pixel of FIG. 3. However, in the pixels of FIGS. 4A to 4C, as in other pixels of global shutter type, light rays received by the pixel may reach memory area 31 and parasitic charges may be photogenerated therein. As a result, the output signal of the pixel may be altered.

Figure 6A:
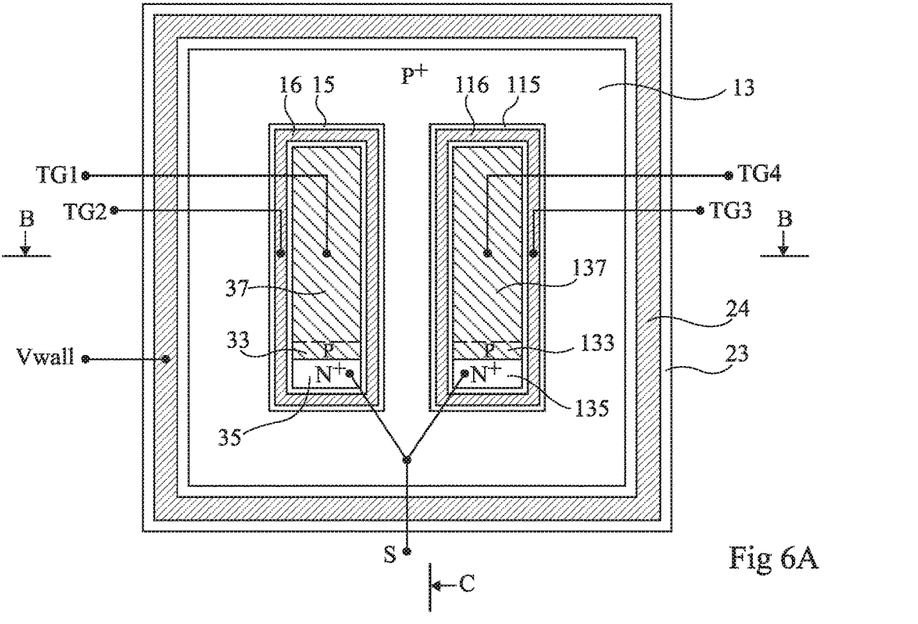
Figure 6B:
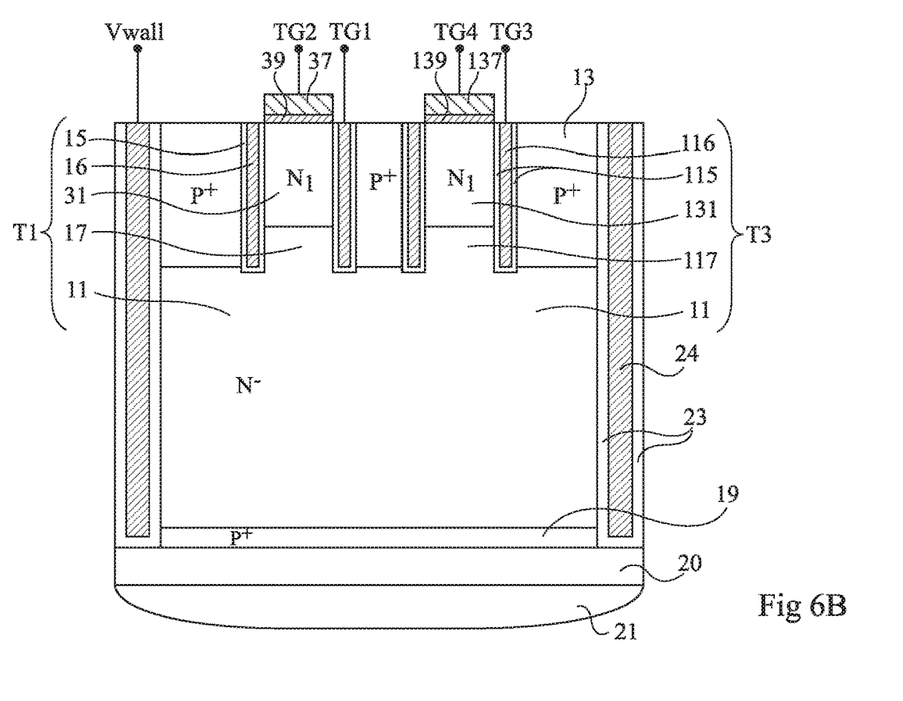
Figure 6C:
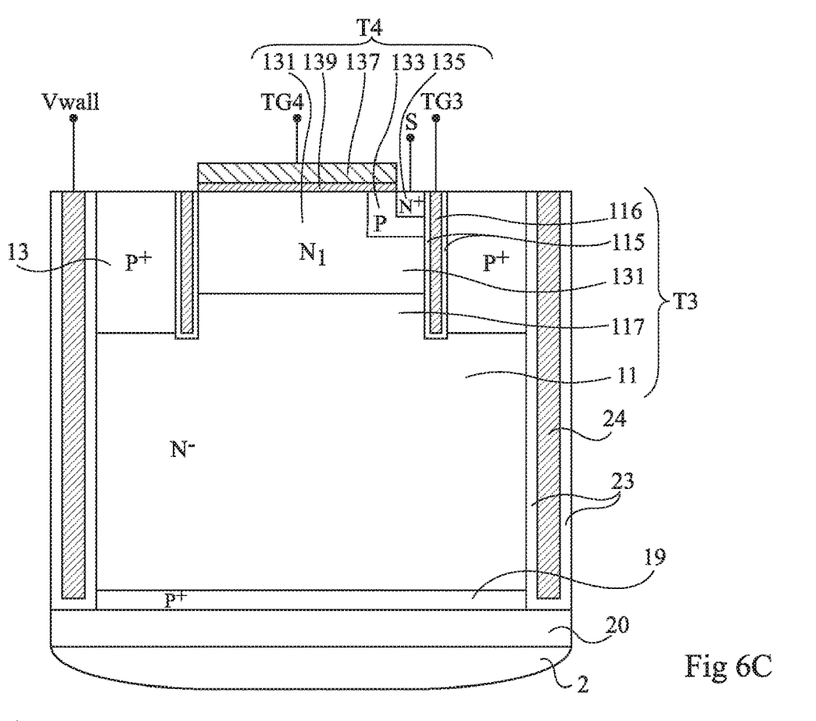

FIGS. 6A to 6C illustrate an embodiment of a pixel, FIG. 6A being a top view of the pixel, FIGS. 6B and 6C being cross-section views along respective planes BB and CC of FIG. 6A.

This pixel comprises the same elements as the pixel of FIGS. 4A to 4C and further comprises a duplication of all the elements forming transistors T1 and T2 (see FIG. 4C) into elements forming transistors T3 and T4, respectively. Thus, FIGS. 6A to 6C show the elements designated with reference numerals 15, 16, 17, 31, 33, 35, 37, and 39 and duplicated elements of same configuration respectively designated with these reference numerals preceded by digit 1. Further, insulated vertical electrode 116 of transistor T3 is connected to a terminal TG3, gate 157 of transistor T4 is connected to a terminal TG4, and read areas 35 and 135 are connected together to node S.

In this embodiment, due to the fact that memory areas 31 and 131 have the same dimensions in bottom view, they are exposed to the same quantity of light radiation and the number of parasitic charges photogenerated in one or the other of memory areas 31 and 131 is substantially identical.

Figure 7:
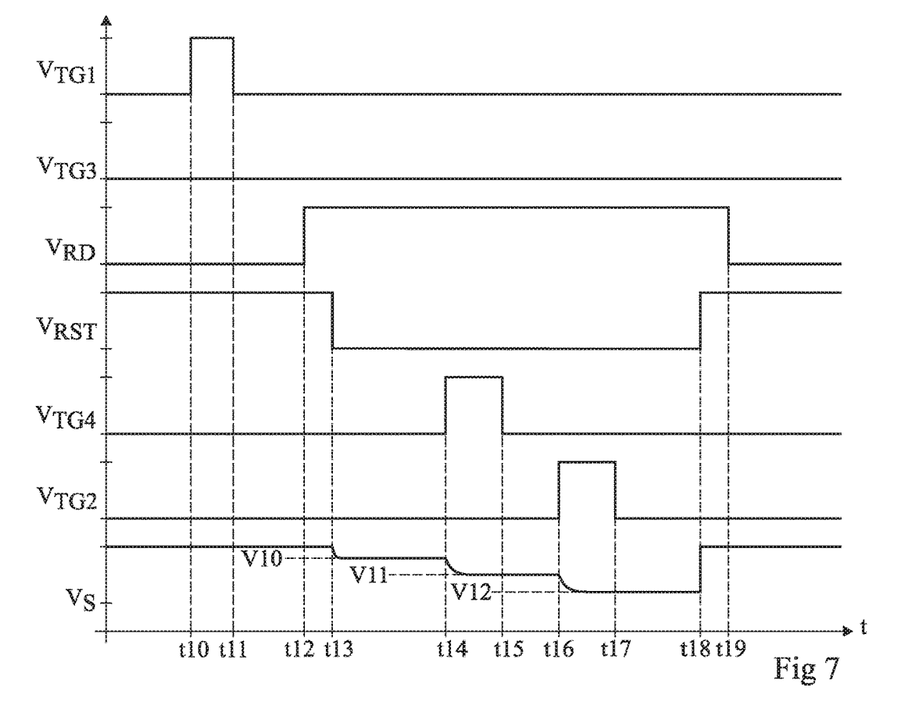
FIG. 7 is a timing diagram illustrating an embodiment of the pixel of FIGS. 6A to 6C.

FIG. 7 shows a timing diagram of voltage $V_S$ and of control signals $V_{TG1}$, $V_{TG2}$, $V_{RD}$, $V_{RST}$, $V_{TG3}$ and $V_{TG4}$, signals $V_{TG3}$ and $V_{TG4}$ being applied to terminals TG3 and TG4, respectively. Like signals $V_{TG1}$, $V_{TG2}$, $V_{RD}$ and $V_{RST}$, signals $V_{TG3}$ and $V_{TG4}$ vary between high and low levels which may be different for each of the signals, and may be supplied by one or a plurality of sensor control circuits.

In operation, the biasing of P+ well 39 and of insulated conductive wall 24 is the same as that described in relation with FIG. 5 and a potential well forms in photosensitive area 11. Further, transistor T3 is permanently kept in the off state, so that transfer region 117 is fully electron-depleted, thus inhibiting charge exchanges between these areas.

Before a time t10, during an integration phase, control signals $V_{RD}$, $V_{RST}$, $V_{TG1}$, and $V_{TG2}$ are at the same voltages as before time t0 of the integration phase described in relation with FIG. 5. Further, transistor T4 is in the off state, control signal $V_{TG4}$ being at a negative voltage, for example, −0.8 V. The pixel receives an illumination on its back side and photogenerated electrons accumulate in photosensitive area 11.

At time t10, at the beginning of a pixel read phase, during a transfer operation, the photogenerated electrons are transferred from photosensitive area 11 to memory area 31 as described in relation with FIG. 5.

At a time t11, transistor T1 is set to the off state and a new integration phase may start while the read phase carries on.

At a time t12, transistor RD is set to the on state to select the pixel.

At a time t13, reset transistor RST is set to the off state. Voltage $V_S$ settles at a level V10 which may be lower than power supply voltage Vdd due to the thermal noise. Voltage level V10 is then read by the read circuit and is stored by the processing circuit.

At a time t14, the parasitic charges photogenerated in memory area 131 are transferred into read area 135. To achieve this, transistor T4 is set to the on state. Voltage $V_S$ then drops to a level V11.

At a time t15, the operation of charge transfer to read area 135 is over and transistor T4 is set back to the off state. Voltage level V11 is then read by the read circuit and stored by the processing circuit. Voltage level V11 is representative of the quantity of parasitic charges photogenerated in memory area 131 before time t14.

Between successive times t16 and t17, the photogenerated electrons stored in memory area 31 are transferred to read area 35 as described in relation with FIG. 5. Voltage $V_S$ then drops to a level V12. Voltage level V12 is representative not only of the quantity of charges photogenerated in photosensitive area 11 before time t10, but also of the quantity of parasitic charges photogenerated in memory area 31 (and thus in memory area 131) before time t16. Voltage level V12 is then read by the read circuit and is stored by the processing circuit.

At a time t18, transistor RST is set to the on state and, at a time t19, the pixel is deselected by setting transistor RD to the off state. The pixel read phase is then over.

Voltage levels V10, V11, and V12 are then used by the processing circuit of the sensor to determine an output signal of the pixel.

A first step of the method comprises calculating a voltage $V_{PAR}$ representative of the quantity of parasitic charges photogenerated in memory area 131 by doing away with the thermal noise at the level of node S. To achieve this, voltage level V10 is subtracted to voltage level V11:

$$V_{PAR} = V11 - V10 \quad (1)$$

A second step of the method comprises calculating an output signal $V_{PIX}$ of the pixel representative of the quantity of charges photogenerated in photosensitive area 11, before time t10, by suppressing the influence of the parasitic charges photogenerated in memory area 31, and the influence of the thermal noise at the level of node S. To achieve this, a voltage $V_{MEM}$ representative of the quantity of charges transferred from photosensitive area 11 to memory area 31 may be calculated according to the following equation (2):

$$V_{MEM} = V12 - V11 \quad (2)$$

The influence of the noise on voltage $V_{MEM}$ is suppressed due to the fact that voltage levels V12 and V11 are influenced by the same thermal noise. Voltage $V_{PIX}$ is then calculated from voltage $V_{MEM}$ and from voltage $V_{PAR}$:

$$V_{PIX} = V_{MEM} - V_{PAR} = V12 - 2*V11 + V10 \quad (3)$$

In an alternative embodiment, memory area 31 has a surface area equal to a times the surface area of memory area 131. Memory area 31 then receives a quantity of light equal to a times the quantity of light received by memory area 131, and the number of parasitic charges photogenerated in second memory area 31 is equal to a times the number of parasitic charges photogenerated in second memory area 131. In this case, during the second step of the above-described method, term a should be taken into account according to the following equation (3'):

$$V_{PIX} = V_{MEM} - a*V_{PAR}$$

$$V_{PIX} = V12 - (1+a)*V11 + a*V10 \quad (3')$$

It should be noted that voltage $V_{PIX}$ may be directly calculated from voltage levels V10, V11, and V12, and from above equation (3) or (3').

Advantageously, in output signal $V_{PIX}$, the influence of the thermal noise and of the parasitic charges photogenerated in memory area 31 has been suppressed.

Further, due to the fact that memory area 131 and transistors T3 and T4 are respectively identical or similar to memory area 31 and to transistors T1 and T2, they may be formed simultaneously. Thus, the method of manufacturing a pixel of the type in FIGS. 6A to 6C requires no additional stage with respect to that of a pixel of the type in FIGS. 4A to 4C.

In alternative embodiments, the order of the steps described in relation with FIG. 7 may be modified. For example, during a read phase, the charge transfer from memory area 31 to read area 35 may be performed before the charge transfer from memory area 131 to read area 135, and/or an additional step during which transistor RST is set to the on state and then to the off state may be provided between the charge transfer to read area 35 and the charge transfer to read area 135.

Whatever the number and the order of the steps implemented during a phase of reading a pixel of the type in FIGS. 6A to 6C, it will be within the abilities of those skilled in the art to calculate a corrected output signal $V_{PIX}$ based on the voltage levels $V_S$ measured after each charge transfer from a memory area to a corresponding read area, and possibly based on the voltage levels $V_S$ measured after transistor RST has been set to the off state.

Correction means similar to those provided in the pixel of FIGS. 6A to 6C may be provided, other pixels comprising a memory area connected by a first transistor to a photosensitive area and by a second transistor to a read area. The correction means then correspond to a duplication of the intermediate memory area, of the first and second transistors, and possibly of the read area, which may be common to the two memory areas. For example, such correction means may be implemented in a pixel of global shutter type which is capable of receiving a front side illumination.

As an example, the various elements of the previously-described pixels have the following dimensions:
- sides having a length in the range from 1 to 3 µm, for example, 1.6 µm, for pixels having a square surface in top view;
- small sides having a length in the range from 0.1 to 0.5 µm, for example, 0.2 µm, and large sides having a length in the range from 0.5 to 2.5 µm, for example, 0.8 µm, for memory areas having rectangular surfaces in top view;
- a thickness in the range from 3 to 15 µm, for example, 10 µm for substrate 11;
- a width in the order of 0.2 µm and a depth in the range from 1.5 to 3 µm, for example, 2 µm, for electrodes 16 and 116;
- a width in the order of 0.4 µm for insulated conductive wall 24;
- a depth substantially equal to that of electrodes 16 and 116 for P$^+$ well 13;
- a depth equal to that of P$^+$ well 13 minus approximately 0.5 µm for memory areas 31 and 131;
- an approximate 0.5-µm thickness for transfer areas 17 and 117;
- a depth in the order of 0.5 µm for intermediate P areas 33 and 133; and
- a depth in the order of 0.2 µm for read areas 35 and 135.

As an example, the layers, wells, and areas of the pixels have the following doping levels:
- in the range from $10^{14}$ to $10^{16}$ at·cm$^{-3}$ for the N$^-$ doping level;
- in the range from $5.10^{16}$ to $5.10^{17}$ at·cm$^{-3}$ for doping level $N_1$;
- in the range from $10^{18}$ to $10^{20}$ at·cm$^{-3}$ for the heavily-doped N-type areas (N$^+$);
- in the range from $10^{18}$ to $10^{19}$ at·cm$^{-3}$ for the heavily-doped P-type layers and wells (P$^+$).

Specific embodiments have been shown and described. Various alterations, modifications, and improvements will occur to those skilled in the art. In particular, although embodiments where the photogenerated charges used to determine the output signal of the pixel are electrons have been described, these embodiments may be adapted to the case where the charges are holes by inverting all the conductivity types of the different areas, layers and wells, and by adapting the voltages and the bias and control signals.

The previously-described pixels may be associated with other pixel read circuits than those described in relation with FIGS. 1 and 2.

The memory areas may have an increasing doping level from the corresponding transfer area to the upper surface of the substrate to improve charge transfers from the memory areas to the corresponding read areas.

Transfer areas 17 and 117 may be doped with the same conductivity type as the memory and photosensitive areas, as previously described, but at an intermediate doping level. These areas may be doped with the conductivity type opposite to that of the memory and photosensitive areas.

The previously-indicated shapes, dimensions, and materials may be modified. For example, in top view, the pixels may have other shapes than a square, for example, a rectangle or a hexagon. Although an insulated conductive wall 24 crossing substrate 11 has been shown, wall 24 may penetrate into the substrate all the way to layer 19 without reaching the lower surface of substrate 11. Insulated conductive wall 24 may be replaced with a P-type doped semiconductor wall or with an insulating wall coated with a P-type doped layer.

The calculation of an output signal of the pixel and/or the storage of the voltage levels of node $V_S$ may be performed by processing software rather than by a hardware processing circuit.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An image sensor, comprising:
   a plurality of pixels, each pixel comprising a photosensitive area, a first memory area, a second memory area, a first insulated electrode configured to control a charge transfer directly from the photosensitive area to the first memory area, and a second insulated electrode configured to control a charge transfer directly from the photosensitive area to the second memory area; and
   a circuit configured, for each pixel, to supply an output signal indicative of a difference between charge stored in the first memory area and charge stored in the second memory area after said charge transfer from the photosensitive area to the first memory area.

2. The sensor of claim 1, wherein the second insulated electrode is configured to keep permanently blocked a charge transfer from the photosensitive area to the second memory area.

3. The sensor of claim 1, wherein each insulated electrode is configured to receive a control signal.

4. An image sensor, comprising:
   a plurality of pixels, wherein each pixel comprises:
      a photosensitive area, a first memory area, a second memory area, a first insulated electrode configured to control a charge transfer from the photosensitive area to the first memory area, and a second insulated electrode configured to control a charge transfer from the photosensitive area to the second memory area;
      a circuit configured, for each pixel, to supply an output signal indicative of a difference between charge stored in the first memory area and charge stored in the second memory area after said charge transfer from the photosensitive area to the first memory area;

a third insulated electrode configured to control a charge transfer from the first memory area to a pixel sense node, and a fourth insulated electrode configured to control a charge transfer from the second memory area to the pixel sense node.

5. The sensor of claim 4, comprising a read circuit connected to the pixel sense node, the read circuit configured to read a first potential after a charge transfer from the first memory area to the pixel sense node and to read a second potential after a charge transfer from the second memory area to the pixel sense node.

6. The sensor of claim 5, wherein the circuit determines the output signal from the first potential and from the second potential.

7. The sensor of claim 4, wherein the second insulated electrode is configured to keep permanently blocked a charge transfer from the photosensitive area to the second memory area.

8. The sensor of claim 4, wherein each insulated electrode is configured to receive a control signal.

9. A back-side illuminated image sensor of global shutter type, wherein each pixel of the image sensor comprises:

a photosensitive area of a first conductivity type;

on a front surface side, a first transistor comprising a vertical ring-shaped electrode penetrating into the photosensitive area and laterally delimiting a first memory area of the first conductivity type which penetrates into the photosensitive area less deeply than the insulated vertical ring-shaped electrode;

a first read area of the first conductivity type formed in an intermediate area of a second conductivity type which is formed in the first memory area;

on the front surface side, a second transistor comprising a vertical ring-shaped electrode penetrating into the photosensitive area and laterally delimiting a second memory area of the first conductivity type which penetrates into the photosensitive area less deeply than the insulated vertical ring-shaped electrode; and a second read area of the first conductivity type formed in an intermediate area of the second conductivity type which is formed in the second memory area.

10. The sensor of claim 9, further comprising:

a first insulated horizontal electrode forming a first gate for controlling transfer of charge from the first memory area to the first read area; and a second insulated horizontal electrode forming a second gate for controlling transfer of charge from the second memory area to the second read area.

11. The sensor of claim 9, further comprising: a circuit configured, for each pixel, to supply an output signal characteristic of a difference between charge stored in the first memory area and charge stored in the second memory area after a charge transfer from photosensitive area to the first memory area.

12. The sensor of claim 9, wherein each pixel comprises an insulated electrode configured to keep permanently blocked a charge transfer from the photosensitive area to the second memory area.

13. An image sensor, comprising:

a plurality of pixels, each pixel comprising:

a semiconductor region of a first conductivity type including a photosensitive area;

a first memory area of the first conductivity type;

a second memory area of the first conductivity type;

a first insulated vertical electrode penetrating into the photosensitive area adjacent the first memory area to a depth greater than a depth of the first memory area and configured to control a charge transfer from the photosensitive area to the first memory area; and a second insulated vertical electrode penetrating into the photosensitive area adjacent the second memory area to a depth greater than a depth of the second memory area and configured to control a charge transfer from the photosensitive area to the second memory area;

a first transfer transistor configured to transfer charge from the first memory area to a sense node; and a second transfer transistor configured to transfer charge from the second memory area to the sense node.

14. The sensor of claim 13, further comprising a circuit configured to supply an output signal indicative of a difference between the charge transferred from the first memory area and the charge transferred from the second memory area.

15. The sensor of claim 13, wherein the second insulated vertical electrode is configured to keep permanently blocked a charge transfer from the photosensitive area to the second memory area.

16. The sensor of claim 13, wherein each insulated vertical electrode is configured to receive a control signal.

17. The sensor of claim 13, wherein:

the first insulated vertical electrode is a vertical ring-shaped electrode penetrating into the photosensitive area and laterally delimiting the first memory area; and the second insulated vertical electrode is a vertical ring-shaped electrode penetrating into the photosensitive area and laterally delimiting the second memory area.

18. The sensor of claim 13, wherein the sense node comprises:

a first read area of the first conductivity type formed in a first intermediate area of a second conductivity type which is formed in the first memory area; and a second read area of the first conductivity type formed in a second intermediate area of the second conductivity type which is formed in the second memory area.

19. The sensor of claim 18, wherein:

the first transfer transistor comprises a first insulated horizontal electrode forming a first gate extending over the first intermediate area of the second conductivity type; and the second transfer transistor comprises a second insulated horizontal electrode forming a second gate extending over the second intermediate area of the second conductivity type.

* * * * *

UNITED STATES PATENT AND TRADEMARK OFFICE
CERTIFICATE OF CORRECTION

PATENT NO. : 10,531,022 B2  
APPLICATION NO. : 15/995249  
DATED : January 7, 2020  
INVENTOR(S) : Francois Roy Page 1 of 1

It is certified that error appears in the above-identified patent and that said Letters Patent is hereby corrected as shown below:

In the Specification

At Column 8, Line number 29, please replace the phrase [[ equal to a times ]] with the phrase -- equal to α times --.

At Column 8, Line numbers 30-31, please replace the phrase [[ equal to a times ]] with the phrase -- equal to α times --.

At Column 8, Line number 33, please replace the phrase [[ equal to a times ]] with the phrase -- equal to α times --.

At Column 8, Line number 36, please replace the phrase [[ term a should be ]] with the phrase -- term α should be --.

Signed and Sealed this  
First Day of September, 2020

Andrei Iancu  
*Director of the United States Patent and Trademark Office*